(12) United States Patent
Barratt

(10) Patent No.: US 9,628,912 B2
(45) Date of Patent: Apr. 18, 2017

(54) AUDIO FILTERS UTILIZING SINE FUNCTIONS

(71) Applicant: Lachlan Paul Barratt, Summer Hill (AU)

(72) Inventor: Lachlan Paul Barratt, Summer Hill (AU)

( * ) Notice: Subject to any disclaimer, the term of this patent is extended or adjusted under 35 U.S.C. 154(b) by 0 days.

(21) Appl. No.: 14/780,367

(22) PCT Filed: Mar. 26, 2014

(86) PCT No.: PCT/AU2014/000317
§ 371 (c)(1),
(2) Date: Sep. 25, 2015

(87) PCT Pub. No.: WO2014/153604
PCT Pub. Date: Oct. 2, 2014

(65) Prior Publication Data
US 2016/0037252 A1 Feb. 4, 2016

Related U.S. Application Data

(60) Provisional application No. 61/805,449, filed on Mar. 26, 2013, provisional application No. 61/805,469, (Continued)

(51) Int. Cl.
*H04R 1/22* (2006.01)
*H04R 3/04* (2006.01)
(Continued)

(52) U.S. Cl.
CPC ............. *H04R 3/04* (2013.01); *G06F 3/165* (2013.01); *G06T 5/00* (2013.01); *G10L 21/0332* (2013.01);
(Continued)

(58) Field of Classification Search
CPC .. H04R 3/04; H04R 1/22; G06F 3/166; H03H 17/0266; H03H 17/0286; H03H 17/0248;
(Continued)

(56) References Cited

U.S. PATENT DOCUMENTS 5,170,369 A * 12/1992 Rossum ................ H03H 17/04
708/320
5,270,481 A 12/1993 Matsunaga et al.
(Continued)

FOREIGN PATENT DOCUMENTS

EP 0795755 A2 9/1997

OTHER PUBLICATIONS

International Search Report for PCT/AU2014/000317, mailed Jun. 14, 2014; ISA/AU.
(Continued)

*Primary Examiner* — Melur Ramakrishnaiah
(74) *Attorney, Agent, or Firm* — Maschoff Brennan

(57) ABSTRACT

A method of digitally filtering an audio signal using an adjusted audio filter. The adjusted audio filter is represented by an impulse response including a waveform in its time domain represented by a sine function of absolute values. A composite audio filter is derived from two adjusted audio filters although any number of filters may be used. The composite audio filter generally includes a bank of the filters which together define a frequency bandwidth representative of the audio signal or spectrum to be filtered. Also a bandpass filter is constructed by combining frequency responses for sine components of absolute values integrated from 0 to bpf and sine components of absolute values integrated from 1/bpf to 0. The frequency response may be the sum of the frequency responses for each of the filters used to create the composite bandpass filter.

11 Claims, 10 Drawing Sheets

Related U.S. Application Data filed on Mar. 26, 2013, provisional application No. 61/805,466, filed on Mar. 26, 2013, provisional application No. 61/805,432, filed on Mar. 26, 2013, provisional application No. 61/805,406, filed on Mar. 26, 2013, provisional application No. 61/805,463, filed on Mar. 26, 2013, provisional application No. 61/819,630, filed on May 5, 2013, provisional application No. 61/903,225, filed on Nov. 12, 2013.

(51) Int. Cl.

| | | |
|---|---|---|
| *G06F 3/16* | (2006.01) | |
| *G10L 21/0332* | (2013.01) | |
| *G06T 5/00* | (2006.01) | |
| *H03H 17/06* | (2006.01) | |
| *H03H 17/02* | (2006.01) | |

(52) U.S. Cl.
CPC .... *H03H 17/0266* (2013.01); *H03H 17/0286* (2013.01); *H04R 1/22* (2013.01); *G06T 2207/20024* (2013.01); *G06T 2207/20172* (2013.01); *H03H 17/0248* (2013.01); *H03H 17/0657* (2013.01)

(58) Field of Classification Search
CPC ................. H03H 17/0657; G06T 5/00; G06T 2207/20024; G06T 2207/20172
USPC ............................. 381/103, 107, 93, 95, 22
See application file for complete search history.

(56) References Cited

U.S. PATENT DOCUMENTS

| | | |
|---|---|---|
| 2003/0154224 A1 | 8/2003 | Jiang et al. |
| 2004/0223620 A1 | 11/2004 | Horbach et al. |
| 2011/0145310 A1 | 6/2011 | Philippe et al. |
| 2012/0213375 A1 | 8/2012 | Mahabub et al. |

OTHER PUBLICATIONS

Akay, S., "Abschlussbericht DSP-Labor WS06/07: Analyse und Erweiterung eines DPOAEGerätes zur Messung von Verzerrungsprodukten im menschlichen Ohr", pp. 1-39 (Apr. 1, 2007).

Beckmann, A., et al., "An Efficient Asynchronous Sampling-Rate Conversion Algorithm for Multi-Channel Audio Applications", Audio Engineering SocietyConvention Paper, pp. 15 (Oct. 7-10, 2005).

Blok., M., "Fractional delay filter design for sample rate conversion", 2012 Federated Conference on Computer Science and Information Systems (FedCSIS), pp. 701-706 (Sep. 9-12, 2012).

Chicharo J.F., "A slidingGoertzel algorithm", Signal Processing, vol. 52, No. 3, pp. 283-297 (Aug. 1, 1996).

Dickens, B., "math: HowTo: a Perfect Reconstruction", Graphic Equalizer, pp. 9 (Dec. 16, 2007).

Extended European Search Report dated Oct. 25, 2016 as received in Application No. 14774918.8.

Franck, A., "Efficient Algorithms for Arbitrary Sample Rate Conversion with Application to Wave Field Synthesis", Thesis, pp. 269 (Nov. 2011).

Jesus, M.D., "Goertzel Filterbank to the Implementation of a Nonuniform DFT", DSP Code Sharing, accessed at https://web.archive.org/web/20130311073415/http://www.dsprelated.com/showcode/49.php, dated Dec. 14, 2010, pp. 2.

Kappeler, R., "Sample Rate Converter 192 kHz Stereo Sample Rate Conversion with B-Spline Interpolation", Thesis, pp. 227 (Mar. 24, 2004).

Russell, A,I., "Efficient Arbitrary Sampling Rate Conversion With Recursive Calculation of Coefficients", IEEE Transactions on Signal Processing, vol. 50, No. 4, pp. 854-865 (Apr. 1, 2002).

* cited by examiner

AUDIO FILTERS UTILIZING SINE FUNCTIONS

This application claims priority from U.S. patent application Ser. No. 61/805,463 filed on 26 Mar. 2013, 61/819,630 filed on 5 May 2013 and 61/903,225 filed on 12 Nov. 2013 the contents of which are to be taken as incorporated herein by these references. This application is also related to and if required claims priority from U.S. patent application Ser. Nos. 61/805,406, 61/805,432, 61/805,466 61/805,469 and 61/805,449 all filed on 26 Mar. 2013, the contents of which are to be taken as incorporated herein by these references.

TECHNICAL FIELD

The present invention relates broadly to a method of digitally filtering an audio signal. The present disclosure relates particularly although not exclusively to digitally filtering an audio signal in audio equalisation (EQ). The present invention extends to other digital filtering including filtering images and other signals including signals associated with digital communications and processing.

Background Art

In digital recording and playback an analog signal representative of audio is converted into a digital signal which lends itself to manipulation and storage. The conversion is performed in an analog to digital converter (ADC). The stored digital signal can be converted back to an analog signal in a digital to analog converter (DAC). The analog signal is played back using conventional audio equipment such as amplifiers and speakers. The digital signal can be manipulated prior to the DAC to improve its quality before playback. This manipulation includes audio EQ where selected parts of the frequency spectrum of the audio are filtered to, for example, compensate for irregularities in the frequency response. The audio may also be filtered to resolve problems from its conversion into a digital signal or back to an analog signal.

SUMMARY OF INVENTION

According to one aspect of the present invention there is provided a method of digitally filtering an audio signal, said method comprising the steps of:
  providing an adjusted audio filter represented by an impulse response including a waveform in its time domain represented by a sine function of absolute values;
  filtering the audio signal using the adjusted audio filter.

Preferably the step of providing an adjusted audio filter involves providing a plurality of adjusted audio filters each including a waveform in their time domain represented by a sine function of absolute values. More preferably the method also comprises the step of combining the adjusted audio filters to provide a composite audio filter. Even more preferably the audio signal is filtered using the composite audio filter. Still more preferably the method also comprises the step of increasing the sample rate of the composite audio filter from a predetermined sample rate to an increased sample rate prior to filtering the audio signal.

Preferably the step of increasing the sample rate of the composite audio filter includes:
  defining intermediate sample points at the increased sample rate located between neighbouring sample points at the predetermined sample rate;
  calculating a weighting for each of the intermediate sample points including the steps of (i) nominating neighbouring audio signals neighbouring an audio signal of the audio filter at respective of the neighbouring sample points (ii) shifting each of the nominated neighbouring audio signals in the time domain between the relevant neighbouring sample point and the intermediate sample point (iii) combining values for the shifted neighbouring audio signals at the intermediate sample point to derive the weighting;
  applying the weighting to the audio signal of the filter at respective of the intermediate sample points.

Preferably the nominated audio signals are shifted in the time domain substantially midway between the neighbouring sample point and the intermediate sample point.

Preferably the step of increasing the sample rate of the composite audio filter includes:
  defining intermediate sample points at the increased sample rate located between neighbouring sample points at the predetermined sample rate;
  calculating a weighting for each of the intermediate sample points including the steps of (i) providing a hypothetical audio signal of a waveform corresponding to an audio signal of the audio filter and shifted in its time domain to align with the intermediate sample point (ii) expanding the shifted hypothetical audio signal in the time domain (iii) combining values for the expanded hypothetical audio signal at the neighbouring sample points to derive the weighting;
  applying the weighting to the audio signal of the filter at respective of the intermediate sample points.

Preferably the shifted hypothetical audio signal is expanded in the time domain by a factor of substantially two (2).

Preferably the step of combining the adjusted audio filters is performed at an adjusted sampling rate wherein the other audio filter includes one or more intervening sample points between adjacent of its neighbouring sample points. More preferably the adjusted sampling rate for applying the audio filter to the other audio filter is inversely proportional to the number of intervening sample points relative to the number of neighbouring sample points for the other filter.

Preferably the step of increasing the sample rate of the composite audio filter includes:
  defining intermediate sample points at the increased sample rate located between neighbouring sample points at the predetermined sample rate;
  calculating a weighting for each of the intermediate sample points including the steps of (i) providing a hypothetical audio signal of a waveform corresponding to an audio signal of the composite audio filter and shifted in its time domain to align with the intermediate sample point (ii) determining values for the hypothetical audio signal at the neighbouring sample points (iii) combining the values for the neighbouring sample points to derive the weighting;
  applying the weighting to the audio signal of the composite audio filter at respective of the intermediate sample points.

Alternatively the step of increasing the sample rate of the composite audio filter includes:
  defining intermediate sample points at the increased sample rate located between neighbouring sample points at the predetermined sample rate;

calculating a weighting for each of the intermediate sample points including the steps of (i) nominating neighbouring audio signals neighbouring an audio signal of the composite audio filter at respective of the neighbouring sample points (ii) combining values for the neighbouring audio signals at the intermediate sample point to derive the weighting;

applying the weighting to the audio signal of the composite audio filter at respective of the intermediate sample points.

Preferably the weighting is applied across a predetermined number of the neighbouring sample points.

According to another aspect of the present invention there is provided a computer or device-readable medium including instructions for digitally filtering an audio signal using an adjusted audio filter including a waveform in its time domain represented by a sine function of absolute values, said instructions when executed by a processor cause said processor to filter the audio signal using the adjusted audio filter.

According to a further aspect of the present invention there is provided a system for digitally filtering an audio signal, said system comprising:

an adjusted audio filter including a waveform in its time domain represented by a sine function of absolute values;

a processor configured to filter the audio signal using the adjusted audio filter.

According to yet another aspect of the present disclosure there is provided a method of digitally filtering a signal, said method comprising the steps of:

providing an adjusted filter represented by an impulse response including a waveform in its time domain represented by a sine function of absolute values;

filtering the signal using the adjusted filter.

Preferably the signal is an electronic signal derived from displacement of a transducer or measurement device.

According to yet a further aspect of the present invention there is provided a method of digitally filtering an image, said method comprising the steps of:

providing an adjusted image filter represented by an impulse response including a waveform in its time domain represented by a sine function of absolute values;

filtering the image using the adjusted image filter.

Preferably the image includes a matrix of pixels to which the composite image filter is applied.

According to still another aspect of the present invention there is provided a method of digitally filtering an audio signal, said method comprising the steps of:

providing an adjusted audio filter represented by an impulse response including a waveform in its time domain represented by a sine function of values from zero to positive infinity only;

filtering the audio signal using the adjusted audio filter

According to still a further aspect of the present invention there is provided a system for digitally filtering an audio signal, said system comprising:

an adjusted audio filter including a waveform in its time domain represented by a sine function of values from zero to positive infinity only;

a processor configured to filter the audio signal using the adjusted audio filter.

BRIEF DESCRIPTION OF DRAWINGS

In order to achieve a better understanding of the nature of the present invention a method of digitally filtering an audio signal will now be described, by way of example only, with reference to the accompanying drawings in which.

DESCRIPTION OF EMBODIMENTS

The present invention in some embodiments may be directed to a method of digitally filtering an audio signal using an adjusted audio filter. The adjusted audio filter is represented by an impulse response including a waveform in its time domain represented by a sine function of absolute values.

Figure 1:
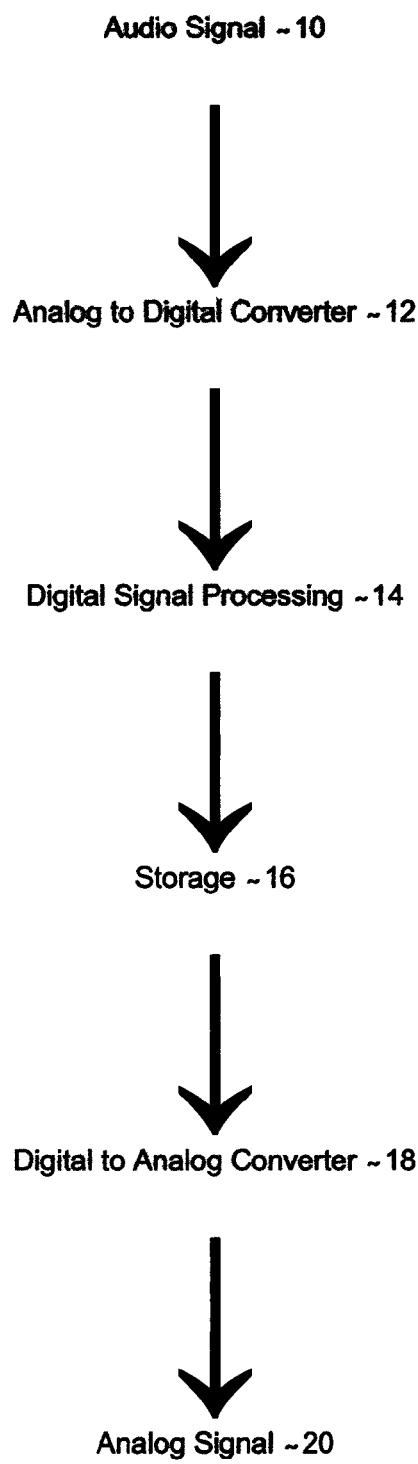
FIG. 1 is a schematic of application of embodiments of the present disclosure in digital audio recording and playback.

FIG. 1 shows application of the various embodiments of the present disclosure in the course of digital audio recording and playback. The analog audio signal 10 is converted to a digital audio signal at an analog to digital converter (ADC) 12. The digital audio signal may then be subject to signal processing at digital processor 14, for example in audio equalisation (EQ). The processed digital signal is downsampled and stored at storage memory 16 before a sample rate increase to increase its resolution prior to playback. The relatively high resolution digital audio signal is then converted back to an analog signal 20 at a digital to analog converter (DAC) 18.

It will be understood that the various embodiments of the present disclosure can be applied:

i) at the ADC 12 where the digital audio signal undergoes a sample rate increase or over-sampling, which in some embodiments, may be performed with weighting;

ii) at the digital signal processor 14 or a digital filter associated with EQ where, for example, the digital signal is filtered with a lowpass filter or bandpass filter;

iii) downstream of the storage memory 16 where the filtered audio signal undergoes a sample rate increase or up-sampling prior to playback.

Some embodiments of the present disclosure may be embodied in computer program code or software. The digital filter of the digital signal processor 14 is represented by a particular frequency response. The particular frequency response is generally dependent on the impulse response of the filter which is characterised by the software or techniques of the various embodiments of the present disclosure. Embodiments of the present disclosure may cover the basic types of frequency response by which digital filters are classified including lowpass, highpass, bandpass and bandreject or notch filters. The digital filters are broadly categorised as Finite Impulse Response (FIR) or Infinite Impulse Response (IIR) filters.

In order to understand this embodiment of audio filtering a composite audio filter is for simplicity derived from two (2) adjusted audio filters although it will be appreciated that any number of filters may be used. The composite audio filter generally includes a bank of the adjusted filters. The bank of filters together define a frequency bandwidth representative of the audio signal or spectrum to be filtered. In this embodiment an impulse response is produced by an impulse fed to the respective filters. The impulse response for each of the adjusted filters may be represented by a sine function of absolute values according to the equation:

$$\text{Sin}\ [2\pi \text{Abs}[x]/bpf]/bpf \qquad \text{Equation 1}$$

Where bpf is the bandpass frequency for the filter, and x is the time variable on the x-axis.

Figure 2:
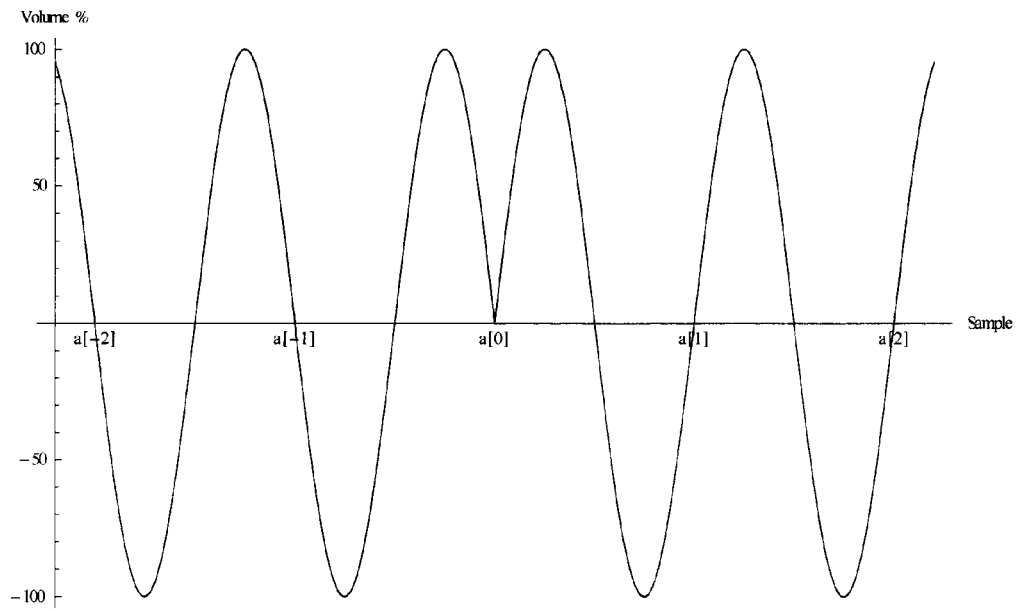
FIG. 2 is an impulse response of an audio filter of an embodiment of the present disclosure.

FIG. 2 illustrates the impulse response of equation 1. It is to be understood that a[0] is the instance at which the impulse occurs and a[n] designates neighbouring sample points for the impulse response where n is the number of the sample point at the predetermined sample rate. In this embodiment the predetermined sample rate is 44.1 kHz (samples per second) although it will be appreciated that any other sample rate may be used depending on the application.

Figure 3:
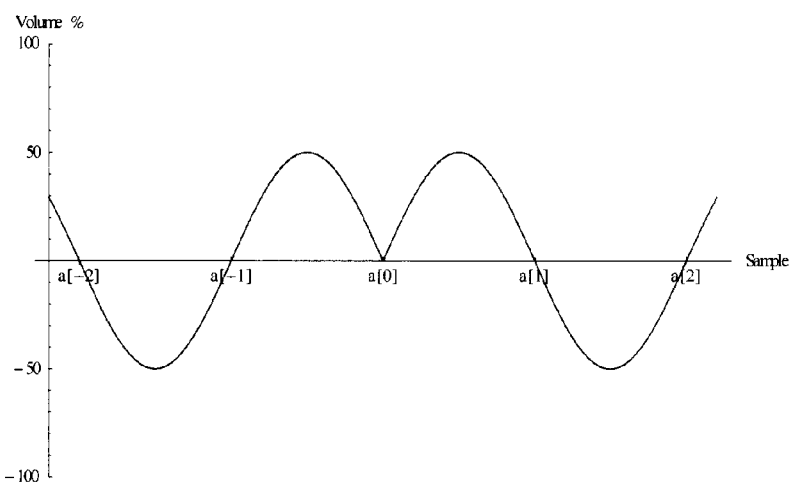
FIG. 3 is another impulse response of another audio filter of this embodiment.

FIG. 3 illustrates the impulse response of equation 1 having a wavelength of two (2) samples whereas FIG. 2 depicts an impulse response having a wavelength of one (1) sample.

Figure 4:
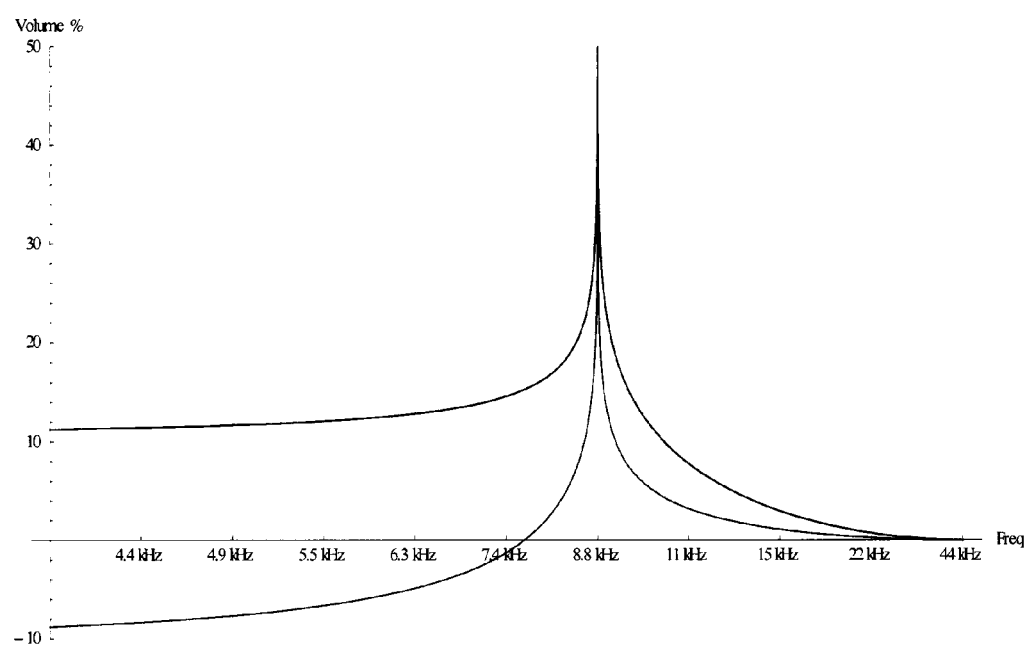
FIG. 4 is a composite audio filter obtained by combining the filters of FIGS. 2 and 3 with one another.

FIG. 4 illustrates the frequency response for sine components of absolute values integrated from 0 to bpf in the uppermost curve. It also illustrates the frequency response for sine components of absolute values integrated from 1/bpf to 0 in the lowermost curve.

In order to "construct" or create the bandpass filter for this embodiment, the curves of FIG. 4 are combined or in this case summed. This can be mathematically represented by the equation:

$$\left(\int_0^{lpf} \text{Sin}\{2\pi \text{Abs}\{x\}/bpf\}/bpf\, dbpf\right)/lpf +$$

$$\left(\int_{1/lpf}^0 \text{Sin}\{2\pi \text{Abs}\{x\}bpf\}bpf\, dbpf\right)lpf$$

Where bpf is the crossover frequency for the bandpass filter, and x is the time variable on the x-axis.

Figure 5:
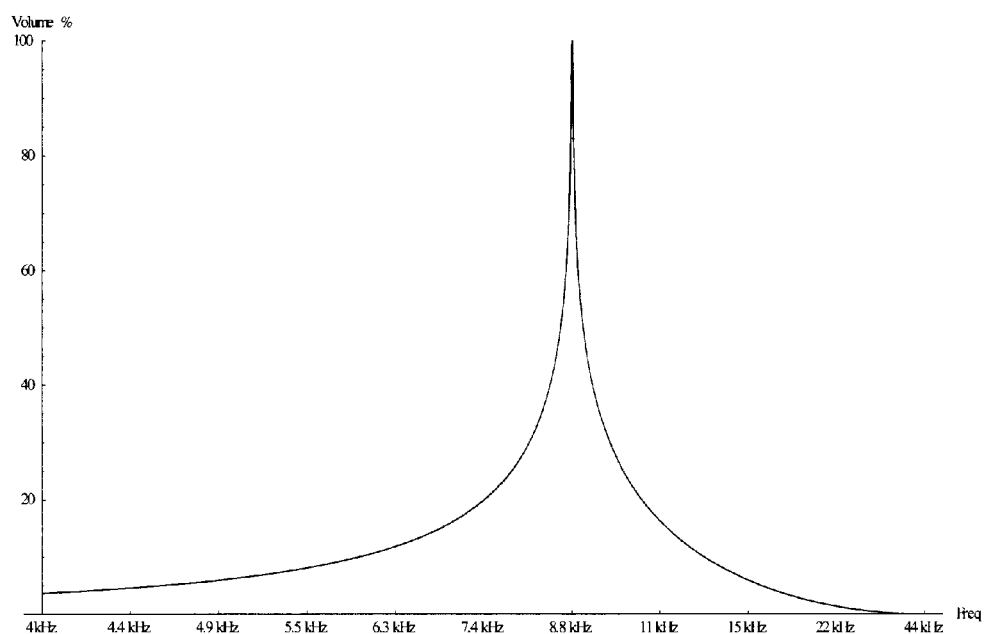
FIG. 5 is a frequency response for the composite bandpass filter of FIG. 4.

FIG. 5 illustrates a frequency response for the composite bandpass filter of this embodiment. This frequency response is the sum of the frequency responses for each of the filters used to create the composite bandpass filter.

Figure 6:
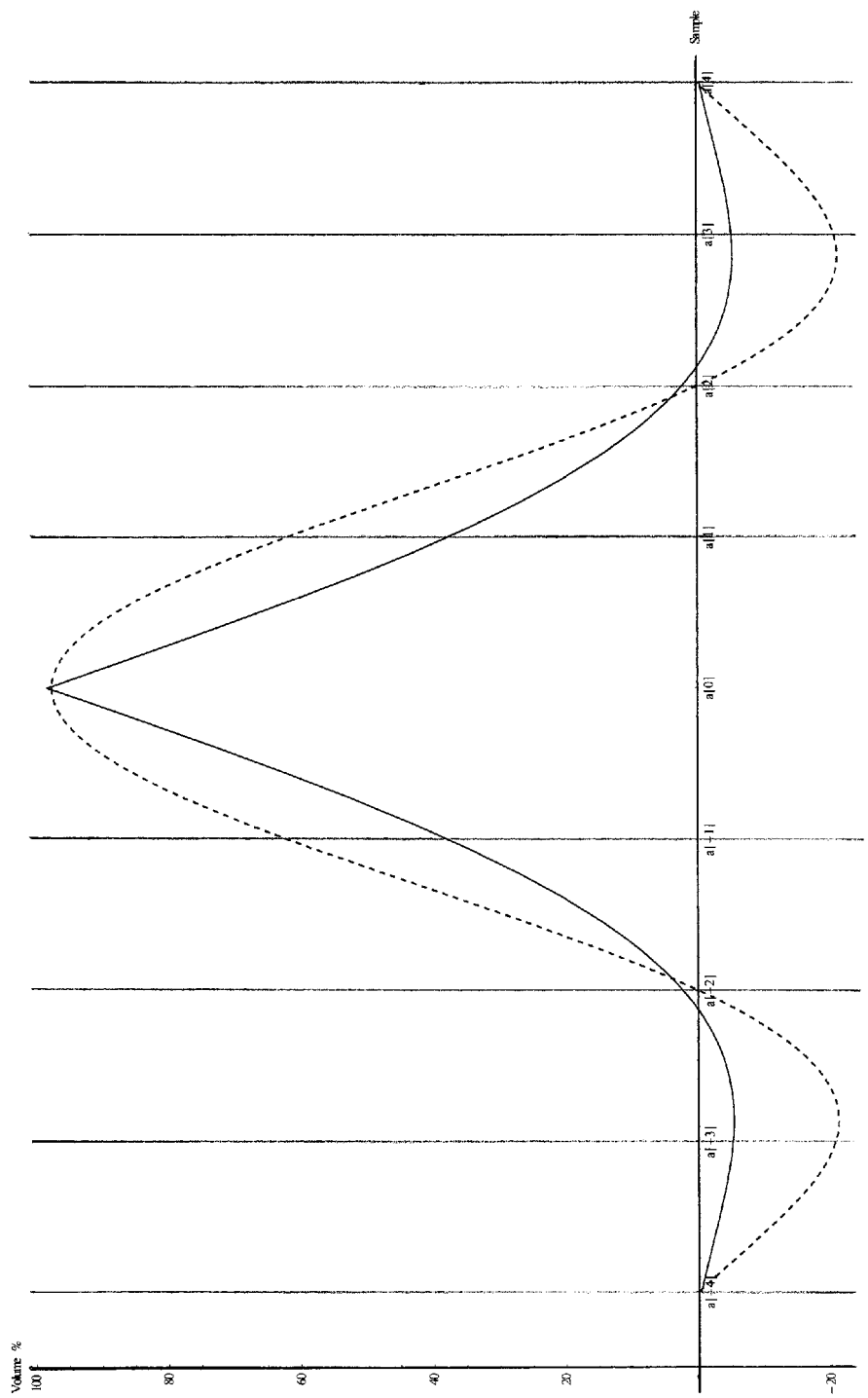
FIG. 6 is an impulse response for the composite audio filter of FIG. 5 together with a typical sinc function impulse response.

FIG. 6 illustrates an impulse response for the composite bandpass audio filter of this embodiment compared with a typical impulse response derived from sinc functions (in broken line detail). It can be seen that the impulse response of this embodiment of the present disclosure is concentrated around the actual occurrence of the audio signal which in practice means less signal smearing. The composite bandpass filter of this example filters wavelengths above four (4) sample wavelengths and the impulse response shows the majority of this filter within these four samples.

In this embodiment the sample rate of the composite audio filter is increased from a predetermined sample rate to an increased sample rate prior to filtering the audio signal.

In some embodiments, the sample rate increase on composite audio filter may be performed by the following two techniques involving:
1. Shifted neighbouring audio signals; and/or
2. Expanded hypothetical impulse response.

Figure 7:
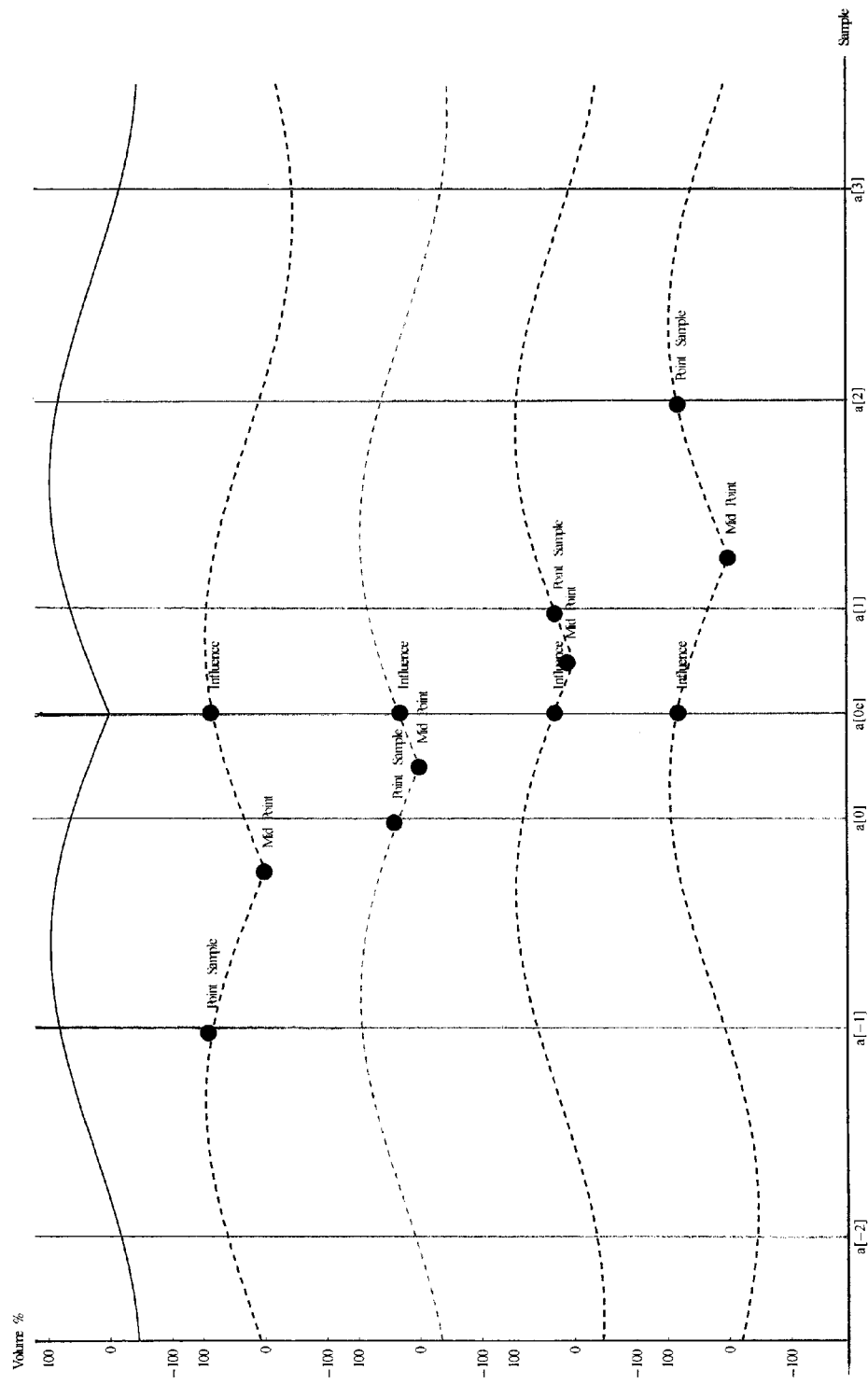
FIG. 7 is a schematic of one technique for increasing the sample rate of the filter.

In weighting values of the impulse response using the shifted neighbouring audio signals, neighbouring impulse responses are nominated from either side of the intermediate sample point to be determined. Each of the nominated neighbouring signals is then shifted in the time domain substantially midway between the neighbouring sample point and the intermediate sample point. In this example the relevant weighting is calculated by summing values which each of the shifted neighbouring impulse responses contribute at the relevant intermediate sample point. This technique is schematically illustrated in FIG. 7. In some embodiments, the weighting may be applied across a predetermined number of the neighbouring sample points, for example 1,024 sample points.

Figure 8:
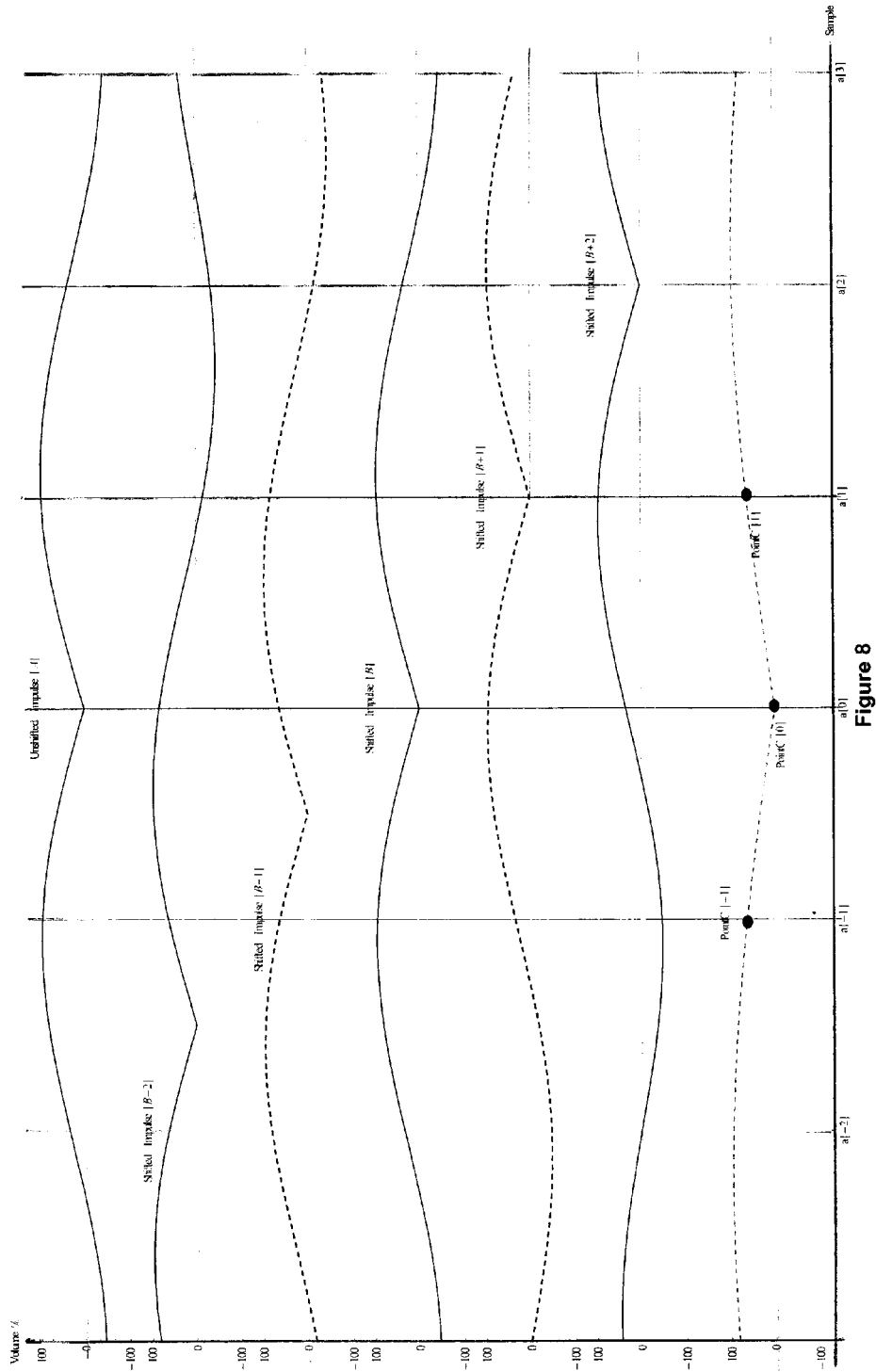
FIG. 8 schematically illustrates one technique for adjusting the sampling rate according to an alternative embodiment of the present disclosure.

In using this weighting technique, combining of the audio filters is performed at the adjusted sampling rate so that neighbouring sample points for the audio filter align or correspond with at least each of the intervening sample points of the other audio filter to which it is applied. This involves shifting the audio filter at the adjusted sampling rate relative to the other audio filter. For example, if the other audio filter includes intervening sample points located substantially midway between adjacent of its neighbouring sample points, the adjusted sampling rate for applying the filters to one another is substantially half the predetermined sample rate. FIG. 8 schematically illustrates this technique for adjusting the sampling rate.

The sampling rate is adjusted in this embodiment by convolving every other impulse response. This means the uppermost impulse response of FIG. 8 is convolved with the three (3) impulse responses shown in solid line detail and the other impulse responses shown in broken line detail are effectively ignored. The resulting or composite audio filter is the lowermost impulse response of FIG. 8 shown in broken line detail and can in this example be represented by the following equations.

$$\text{New Convolved PointC}[-1]\ \text{is}\ \sum_{-\infty}^{\infty} \text{Impulse}[A]*\text{Impulse}[B-2]$$

$$\text{New Convolved PointC}[0]\ \text{is}\ \sum_{-\infty}^{\infty} \text{Impulse}[A]*\text{Impulse}[B]$$

$$\text{New Convolved PointC}[1]\ \text{is}\ \sum_{-\infty}^{\infty} \text{Impulse}[A]*\text{Impulse}[B+2]$$

For a predetermined sample rate of 44.1 kHz the adjusted sampling rate in this example is 22.05 kHz. If the other audio filter includes nine (9) intervening sample points between adjacent of its neighbouring sample points the adjusted sampling rate will be one tenth of the predetermined sample rate. This equates to an adjusted sampling rate of 4.41 kHz for a predetermined sample rate of 44.1 kHz. It is understood that adjusting the sampling rate "corrects" for shifting of the nominated neighbouring sample points in calculating weightings for each of the intermediate sample points. The shift in the nominated neighbouring signals in the time domain is generally proportional to the adjustment in the sampling rate in convolving the audio filters. Thus, a shift in the nominated neighbouring signals midway between neighbouring sample point and the intermediate sample point means an adjustment in the sampling rate by a factor of substantially one-half.

Figure 9:
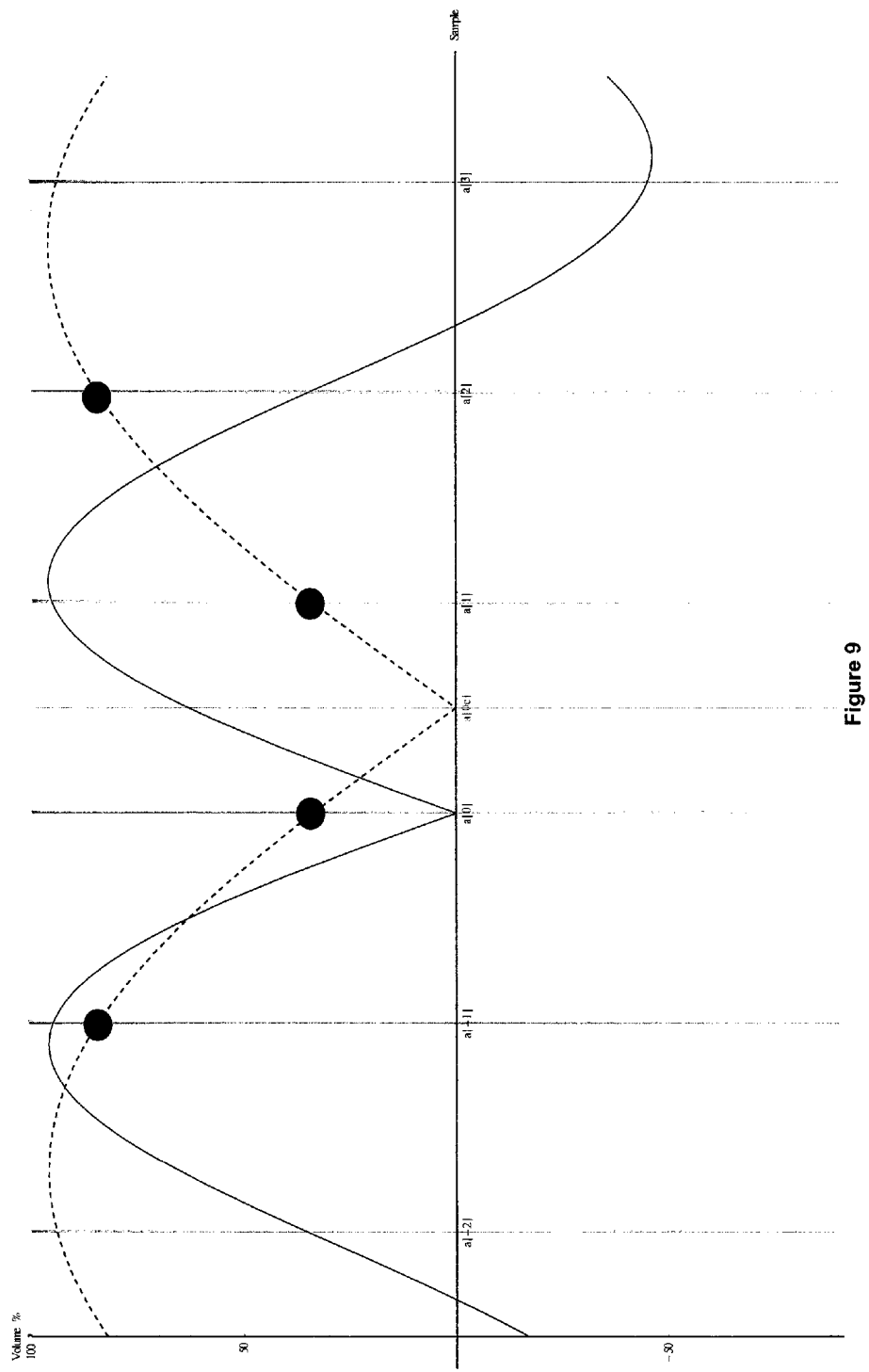
FIG. 9 is a schematic of another technique for increasing the sample rate of the filter.

In weighting values of the impulse response using the expanded hypothetical impulse response, the relevant impulse response is effectively replicated as a hypothetical impulse response with its time domain shifted to align with the intermediate sample point to be determined. In some embodiments, the hypothetical and shifted impulse response may be expanded in its time domain by factor of substantially 2. In this example the relevant weighting is calculated by summing values for the expanded impulse response at the neighbouring sample points. This technique is schematically illustrated in FIG. 9. In some embodiments, the weighting may be applied across a predetermined number of the neighbouring sample points, for example 1,024 sample points.

In these and other embodiments, the sample rate increase may be performed by the following two (2) techniques involving (i) a hypothetical audio signal, and/or (ii) neighbouring audio signals.

Figure 10:
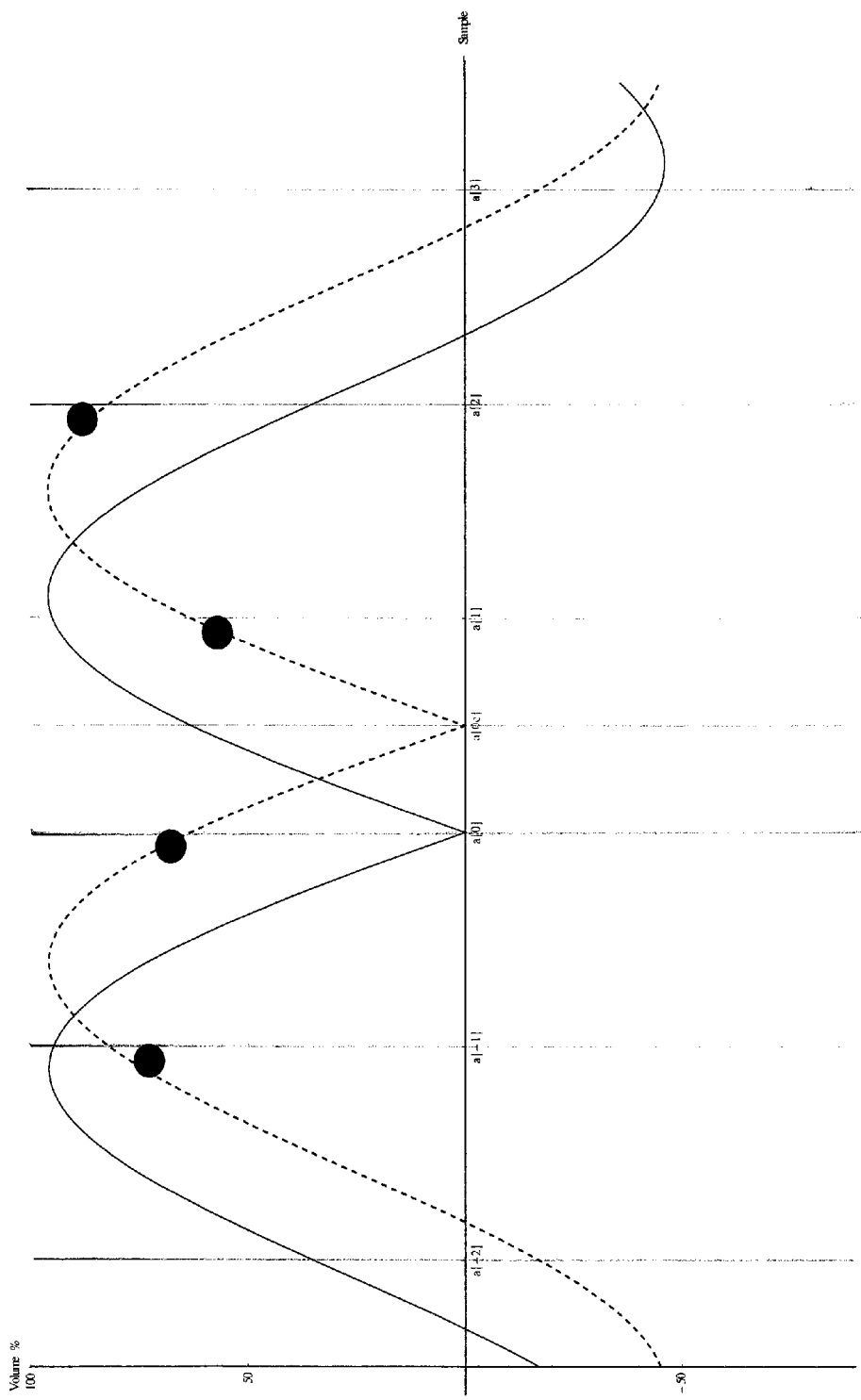
FIG. 10 is a schematic of an alternative technique for increasing the sample rate of an impulse response.

In weighting values of the composite filter using the hypothetical audio signal, the relevant impulse response may be effectively replicated with its time domain shifted to align with the intermediate sample point to be determined. The weighting is calculated by summing values for the hypothetical audio signal at the neighbouring sample points and the weighting is a factor inversely proportional to the sum of these values. The relevant weighting or factor may be applied to the composite filter at respective of the intermediate sample points. This technique is schematically illustrated in FIG. 10. As mentioned previously, in some embodiments, the weighting may be calculated across a predetermined number of the neighbouring sample points.

Figure 11:
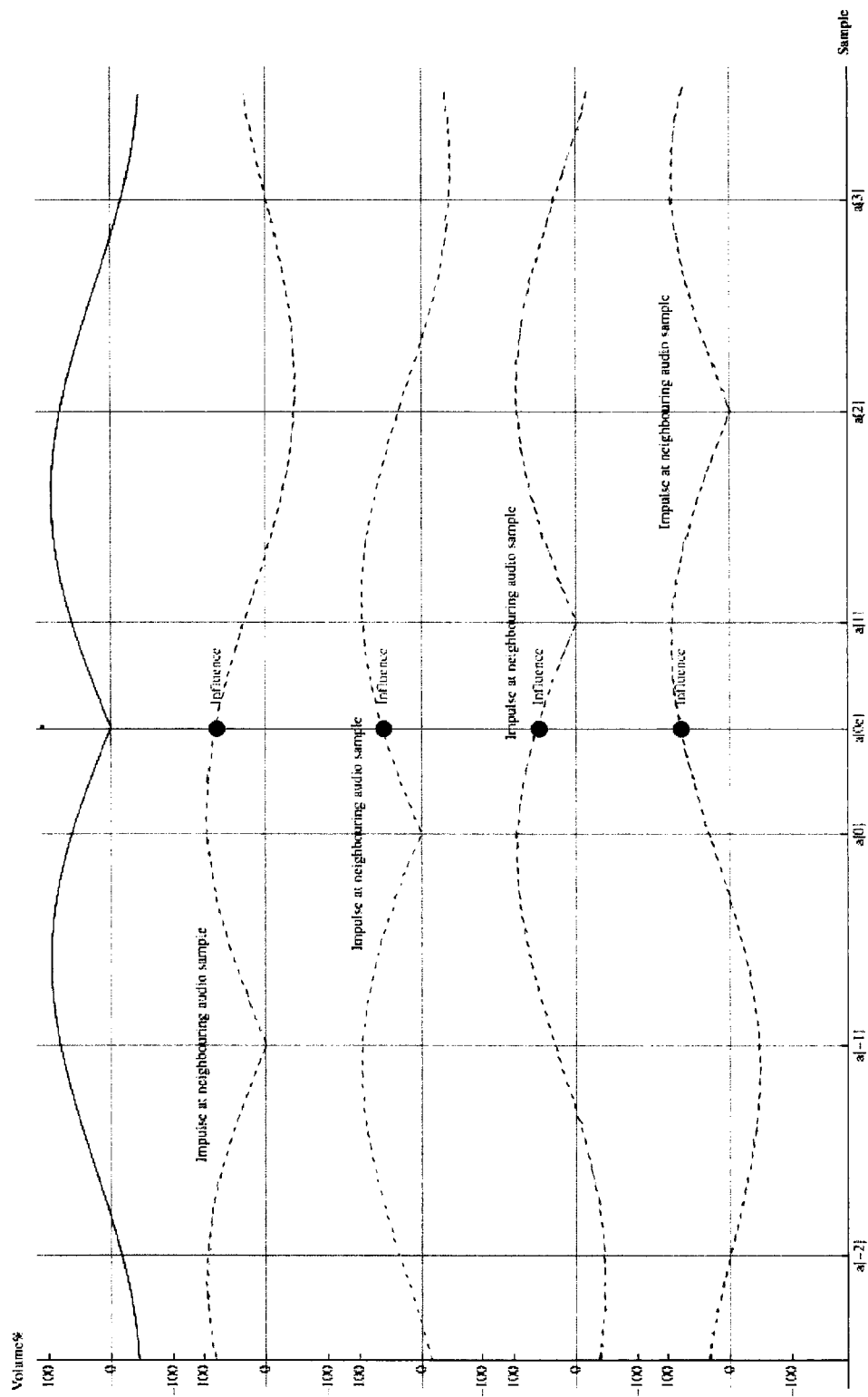
FIG. 11 is a schematic of another alternative technique for increasing the sample rate of an impulse response.

In weighting values of the composite filter using the neighbouring audio signals, neighbouring impulse responses are nominated either side of the intermediate sample point to be determined. In this example the relevant weighting is calculated by summing values which each of the nominated neighbouring impulse responses contribute at the relevant intermediate sample point. This technique is schematically illustrated in FIG. 11. The weighting may be applied across a predetermined number of the neighbouring sample points, for example 1024 sample points.

The impulse response may also have an averaging curve applied to it where for example $e^{-(qx)^2}$ represents an averaging curve with q representing the aspect ratio of the averaging curve. The averaging curve may be adjusted to a width which is proportional to the wavelength of the impulse response to which it is applied.

In these or other embodiments, the impulse response may be constructed from a waveform in its time domain represented by a sine function of values from zero (0) to positive infinity. The waveform may not include values from below zero (0) to minus infinity. The audio filter represented by the impulse response may be subjected to a sample rate increase using one or more of the techniques described in the context of the earlier embodiment. The impulse response may have an averaging curve applied to it as described in the preceding paragraph.

Now that several embodiments of the present disclosure have been described it will apparent to those skilled in the art that the method of digitally filtering an audio signal has a least the following advantages over the prior art:

1. The audio signal is filtered using an adjusted audio filter which provides a relatively "smooth" filter in its frequency response;
2. The adjusted audio filters can be combined to provide a composite filter for improved filtering in for example EQ;
3. The composite audio filter substantially reduces unwanted resonants inherent in analog and prior digital filters;
4. It provides a frequency response which is smoother and in this respect more akin to an analog filter.

Those skilled in the art will appreciate that the disclosure described herein is susceptible to variations and modifications other than those specifically described.

The processing of audio signals need not be limited to acoustics but extends to other sound applications including ultrasound and sonar. The present disclosure also extends beyond audio signals to other signals including signals derived from a physical displacement such as that obtained from measurement devices, for example a strain gauge or other transducer which generally converts displacement into an electronic signal. The present disclosure also covers digital filtering of signals associated with digital communications The present disclosure in another embodiment is applied to imaging. For example, each of the pixels in a matrix of pixels in the image is processed with a sample rate increase. In increasing the sample rate to include intermediate points, these intermediate points are weighted depending on the influence of neighbouring sample points.

All such variations and modifications are to be considered within the scope of the present disclosure the nature of which is to be determined from the foregoing description.

The invention claimed is:

1. A method of digitally filtering an audio signal, said method comprising the steps of:
providing an plurality of audio component filters each substantially represented by a waveform in its time domain represented by a sine function of absolute values;
combining the component filters to provide a composite audio filter; and
filtering the audio signal using the composite audio filter.

2. A method as defined in claim 1 also comprising the step of increasing the sample rate of the composite audio filter from a predetermined sample rate to an increased sample rate prior to filtering the audio signal.

3. A method as defined in claim 2 wherein the step of increasing the sample rate of the composite audio filter includes:
defining intermediate sample, points at the increased sample rate located between neighbouring sample points at the predetermined sample rate;
calculating a weighting for each of the intermediate sample points including the steps of (i) nominating neighbouring waveforms substantially representative of the audio filter at respective of the neighbouring sample points (ii) shifting each of the nominated waveforms in the time domain between the relevant neighbouring sample point and the intermediate sample point (iii) combining values for the shifted neighbouring waveforms at the intermediate sample point to derive the weighting; and
applying the weighting to the audio signal of the filter at respective of the intermediate sample points.

4. A method as defined in claim 3 wherein the nominated waveforms are shifted in the time domain substantially midway between the neighbouring sample point and the intermediate sample point.

5. A method as defined in claim 3 wherein the weighting is applied across a predetermined number of the neighbouring sample points.

6. A method as defined in claim 2 wherein the step of increasing the sample rate of the composite audio filter includes:
   defining intermediate sample points at the increased sample rate located between neighbouring sample points at the predetermined sample rate;
   calculating a weighting for each of the intermediate sample points including the steps of (i) providing a hypothetical waveform substantially representative of the audio filter and shifted in its time domain to align with the intermediate sample point (ii) expanding the shifted waveform in the time domain (iii) combining values for the expanded waveform at the neighbouring sample points to derive the weighting; and
   applying the weighting to the audio signal of the filter at respective of the intermediate sample points.

7. A method as defined in claim 6 wherein the shifted waveform is expanded in the time domain by a factor of substantially two (2).

8. A method as defined in claim 2 wherein the step of increasing the sample rate of the composite audio filter includes:
   defining intermediate sample points at the increased sample rate located between neighbouring sample points at the predetermined sample rate;
   calculating a weighting for each of the intermediate sample points including the steps of (i) providing a hypothetical waveform substantially representative of the composite audio filter and shifted in its time domain to align with the intermediate sample point (ii) determining values for the hypothetical waveform at the neighbouring sample points (iii) combining the values for the neighbouring sample points to derive the weighting; and
   applying the weighting to the audio signal of the composite audio filter at respective of the intermediate sample points.

9. A method as defined in claim 2 wherein the step of increasing the sample rate of the composite audio filter includes:
   defining intermediate sample points at the increased sample rate located between neighbouring sample points at the predetermined sample rate;
   calculating a weighting for each of the intermediate sample points including the steps of (i) nominating neighbouring audio waveforms substantially representative of the composite audio filter at respective of the neighbouring sample points (ii) combining values for the neighbouring waveforms at the intermediate sample point to derive the weighting; and
   applying the weighting to the audio signal of the composite audio filter at respective of the intermediate sample points.

10. A non-transitory computer or device-readable medium including instructions for digitally filtering an audio signal using a plurality of audio component filters each substantially represented by a waveform in its time domain represented by a sine function of absolute values, said instructions when executed by a processor cause said processor to:
   combine the component filters to provide a composite audio filter; and
   filter the audio signal using the adjusted audio filter.

11. A system for digitally filtering an audio signal, said system comprising:
   a plurality of audio component filters each substantially represented by a waveform in its time domain represented by a sine function of absolute values;
   a processor configured to:
   combine the component filters to provide a composite audio filter; and
   filter the audio signal using the composite audio filter.

* * * * *